United States Patent
Lee

(10) Patent No.: US 9,766,296 B2
(45) Date of Patent: Sep. 19, 2017

(54) METHOD FOR CORRECTING VOLTAGE SENSOR INCLUDED IN BATTERY RACK

(71) Applicant: LG CHEM, LTD., Seoul (KR)

(72) Inventor: Hyun-Chul Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 191 days.

(21) Appl. No.: 14/891,855

(22) PCT Filed: Nov. 28, 2014

(86) PCT No.: PCT/KR2014/011585
§ 371 (c)(1),
(2) Date: Nov. 17, 2015

(87) PCT Pub. No.: WO2015/080526
PCT Pub. Date: Jun. 4, 2015

(65) Prior Publication Data
US 2016/0084912 A1    Mar. 24, 2016

(30) Foreign Application Priority Data

Nov. 29, 2013  (KR) .................... 10-2013-0147650

(51) Int. Cl.
*G01N 27/416*  (2006.01)
*G01R 19/00*  (2006.01)
(Continued)

(52) U.S. Cl.
CPC ....... *G01R 31/3606* (2013.01); *G01R 31/362* (2013.01); *G01R 31/3658* (2013.01);
(Continued)

(58) Field of Classification Search
CPC  Y02E 60/12; G01R 31/3648; G01R 31/3627; G01R 31/3662; G01R 31/3631;
(Continued)

(56) References Cited

U.S. PATENT DOCUMENTS

| 2007/0024240 A1* | 2/2007 | Morita ............... G01R 31/3675 320/128 |
| 2008/0100268 A1 | 5/2008 | Lim et al. |
| 2011/0074354 A1 | 3/2011 | Yano |
| 2011/0175564 A1 | 7/2011 | Shim |
| 2013/0002259 A1* | 1/2013 | Cheng ................. G01R 31/362 324/426 |
| 2013/0046495 A1 | 2/2013 | Sim |

(Continued)

FOREIGN PATENT DOCUMENTS

| JP | 2007-033320 A | 2/2007 |
| KR | 10-2008-0039653 A | 5/2008 |

(Continued)

OTHER PUBLICATIONS

International Search Report issued in PCT/KR2014/011585, dated Mar. 4, 2015.

*Primary Examiner* — Yalkew Fantu
*Assistant Examiner* — Mohammed J Sharief
(74) *Attorney, Agent, or Firm* — Birch, Stewart, Kolasch & Birch, LLP

(57) ABSTRACT

The present invention discloses a method for correcting a voltage sensor. Because a plurality of battery racks are electrically connected to a power storage apparatus in parallel, a voltage sensor connected to each of the battery racks can be influenced by the voltage of other adjacent battery racks when measuring the voltage of each of the battery racks. Therefore, after electrically connecting only one battery rack to the voltage sensor, the voltage value measured by the corresponding voltage sensor is corrected.

10 Claims, 2 Drawing Sheets

(51) Int. Cl.
  *G01R 31/00* (2006.01)
  *G01R 31/36* (2006.01)
  *G01R 35/00* (2006.01)
  *H01M 10/42* (2006.01)
  *H01M 10/48* (2006.01)

(52) U.S. Cl.
  CPC ........... *G01R 35/00* (2013.01); *G01R 35/005* (2013.01); *H01M 10/425* (2013.01); *H01M 10/482* (2013.01)

(58) Field of Classification Search
  CPC .............. G01R 31/3606; G01R 31/362; G01R 31/3658; G01R 35/00; G01R 35/005; H01M 10/425; H01M 10/482
  USPC ...................................... 324/76.11, 426, 500
  See application file for complete search history.

(56) References Cited

U.S. PATENT DOCUMENTS

| | | | | |
|---|---|---|---|---|
| 2014/0009117 | A1* | 1/2014 | Ishii | H02J 7/34 320/126 |
| 2015/0077061 | A1* | 3/2015 | Nomura | H01M 10/441 320/126 |

FOREIGN PATENT DOCUMENTS

| | | |
|---|---|---|
| KR | 10-1028024 B1 | 4/2011 |
| KR | 10-2011-0084754 A | 7/2011 |
| KR | 10-2013-0020638 A | 2/2013 |
| WO | WO 2012/133274 A1 | 10/2012 |
| WO | WO 2013/140894 A1 | 9/2013 |

* cited by examiner

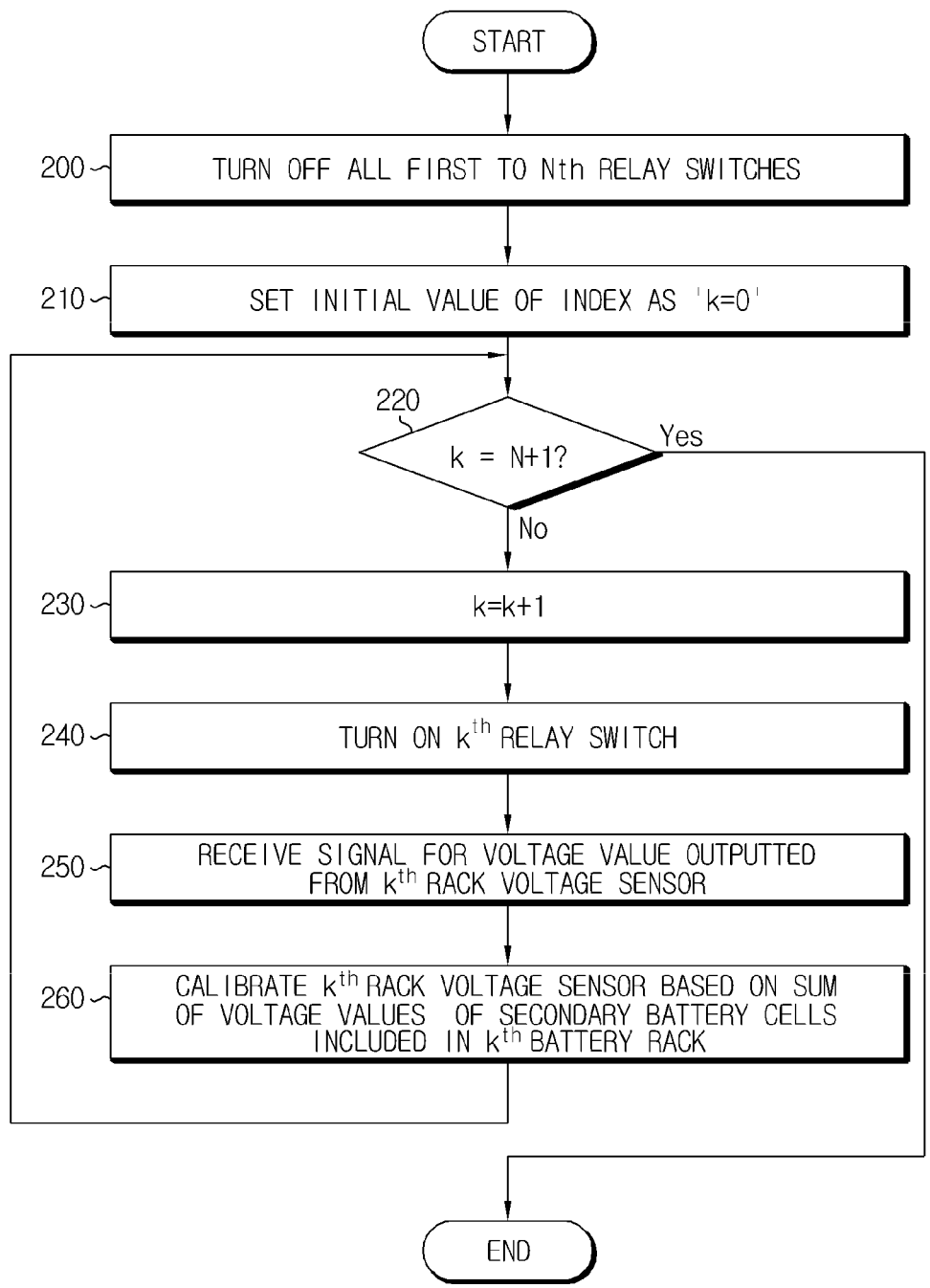

“METHOD FOR CORRECTING VOLTAGE SENSOR INCLUDED IN BATTERY RACK

TECHNICAL FIELD

The present disclosure relates to a method for calibrating a voltage sensor included in a battery rack, and more particularly, to a method for calibrating a value of a voltage sensor included in each battery rack of an energy storage device including multiple battery racks electrically connected in parallel.

The present application claims priority to Korean Patent Application No. 10-2013-0147650 filed in the Republic of Korea on Nov. 29, 2013, the disclosures of which are incorporated herein by reference.

BACKGROUND ART

Due to its characteristics of being easily applicable to various products and electrical characteristics such as a high energy density, a secondary battery is not only commonly applied to a portable device, but universally applied to an electric vehicle (EV) or a hybrid electric vehicle (HEV) propelled by an electric driving source. This secondary battery is gaining attention for its primary advantages of remarkably reducing the use of fossil fuels and not generating by-products from the use of energy, making it a new eco-friendly and energy efficient source of energy.

Recently, with the growing interests in smart grid, a large capacity energy storage device that stores excess energy is required to build an intelligent electrical grid. To build a large capacity energy storage device, a plurality of small capacity energy storage devices may be combined in series or parallel into a large capacity energy storage device.

As a small capacity energy storage device, a battery rack including a plurality of secondary battery cells is used. The secondary battery cells are electrically connected in series based on the required output voltage of the energy storage device, and the secondary battery cells are electrically connected to each other in parallel based on the required capacity of the energy storage device.

The large capacity energy storage device has a control unit to manage a plurality of battery racks included in the energy storage devices. The control unit measures the voltage of each battery rack, determines the state of charge of each battery rack, and using the voltage information, controls the charge and discharge of each battery rack. Thus, accuracy is important to a voltage sensor which measures the voltage of each battery rack. To this end, voltage sensors connected to each battery rack need to ensure accuracy through a calibration operation.

However, as disclosed in Korean Patent Application Publication No. 10-2011-0084754, when a plurality of battery racks is connected in parallel, and in this state, voltage sensors included in each battery rack measure the voltage, the voltage measured by the voltage sensors may be influenced by adjacent other battery rack. Thus, the voltage sensors connected to the battery racks may be calibrated by an inaccurate value.

Therefore, there is a need for a method for calibrating voltage sensors while avoiding the influence by adjacent battery racks.

DISCLOSURE

Technical Problem

The present disclosure is designed to solve the problem of the related art, and therefore, the present disclosure is directed to providing an energy storage device and a method for calibrating a voltage sensor included in a battery rack.

Technical Solution

To achieve the above object, an energy storage device according to the present disclosure includes first to $N^{th}$ battery racks, each including a plurality of secondary battery cells electrically connected in series, the first to $N^{th}$ battery racks being electrically connected to each other in parallel, first to $N^{th}$ relay switches electrically connected in series to a high potential terminal or a low potential terminal of each battery rack, and designed to turn on or off in response to a control signal, first to $N^{th}$ rack voltage sensors electrically connected to each battery rack and each relay switch in parallel, and configured to output a measured voltage value as a signal, and a rack control unit configured to output a signal to control the turn-on or turn-off of the first to $N^{th}$ relay switches, and to receive the signals for the voltage values of the first to $N^{th}$ battery racks from the first to $N^{th}$ rack voltage sensors, wherein the rack control unit outputs a control signal to turn on only a relay switch electrically connected to any one battery rack (hereinafter referred to as a target rack) among the first to $N^{th}$ battery racks, and calibrates a signal for a voltage value outputted from a voltage sensor electrically connected to the target rack based on a sum of voltage values of secondary battery cells included in the target rack.

The rack control unit according to the present disclosure may turn on all the first to $N^{th}$ relay switches one by one in a sequential order.

According to one embodiment of the present disclosure, the rack control unit may receive the voltage values of the plurality of secondary battery cells included in each battery rack directly from a plurality of cell voltage sensors, and may sum up the voltage values of the secondary battery cells included in the target rack, the cell voltage sensors being configured to measure the voltage values of the plurality of secondary battery cells and output signals.

According to another embodiment of the present disclosure, the rack control unit may receive the voltage values of the plurality of secondary battery cells included in the target rack from first to $N^{th}$ cell management units, and may sum up the voltage values of the secondary battery cells included in the target rack, the first to $N^{th}$ cell management units being configured to receive signals for voltage values from a plurality of secondary battery cell voltage sensors included in each battery rack, respectively.

According to still another embodiment of the present disclosure, the rack control unit may receive a sum of the voltage values of the secondary battery cells included in the target rack from first to $N^{th}$ cell management units configured to receive signals for voltage values from a plurality of secondary battery cell voltage sensors included in each battery rack, respectively, and to sum up the voltage values of the secondary battery cells included in the target rack.

To achieve the object, there is provided a method for calibrating a rack voltage sensor of an energy storage device according to the present disclosure, which calibrates a rack voltage sensor of an energy storage device including first to $N^{th}$ battery racks including a plurality of secondary battery cells electrically connected in series, first to $N^{th}$ relay switches electrically connected in series to a high potential terminal or a low potential terminal of each battery rack, and designed to turn on or off in response to a control signal, first to $N^{th}$ rack voltage sensors electrically connected to each battery rack and each relay switch in parallel, and configured to output a measured voltage value as a signal, and a rack control unit configured to output a signal to control the turn-on or turn-off of the first to $N^{th}$ relay switches, and to receive the signals for the voltage values of the first to $N^{th}$ battery racks from the first to $N^{th}$ rack voltage sensors, the method including (a) outputting, by the rack control unit, a control signal to turn on only a relay switch electrically connected to any one battery rack (hereinafter referred to as a target rack) among the first to $N^{th}$ battery racks, and (b) calibrating, by the rack control unit, a signal for a voltage value outputted from a voltage sensor electrically connected to the target rack based on a sum of voltage values of secondary battery cells included in the target rack.

Advantageous Effects

According to the present disclosure, a voltage sensor which measures the voltage of a battery rack may be accurately calibrated.

DESCRIPTION OF DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawing.

FIG. 2 is a flowchart illustrating a method for calibrating a rack voltage sensor of an energy storage device according to an exemplary embodiment of the present disclosure.

MODE FOR CARRYING OUT THE INVENTION

Figure 1:
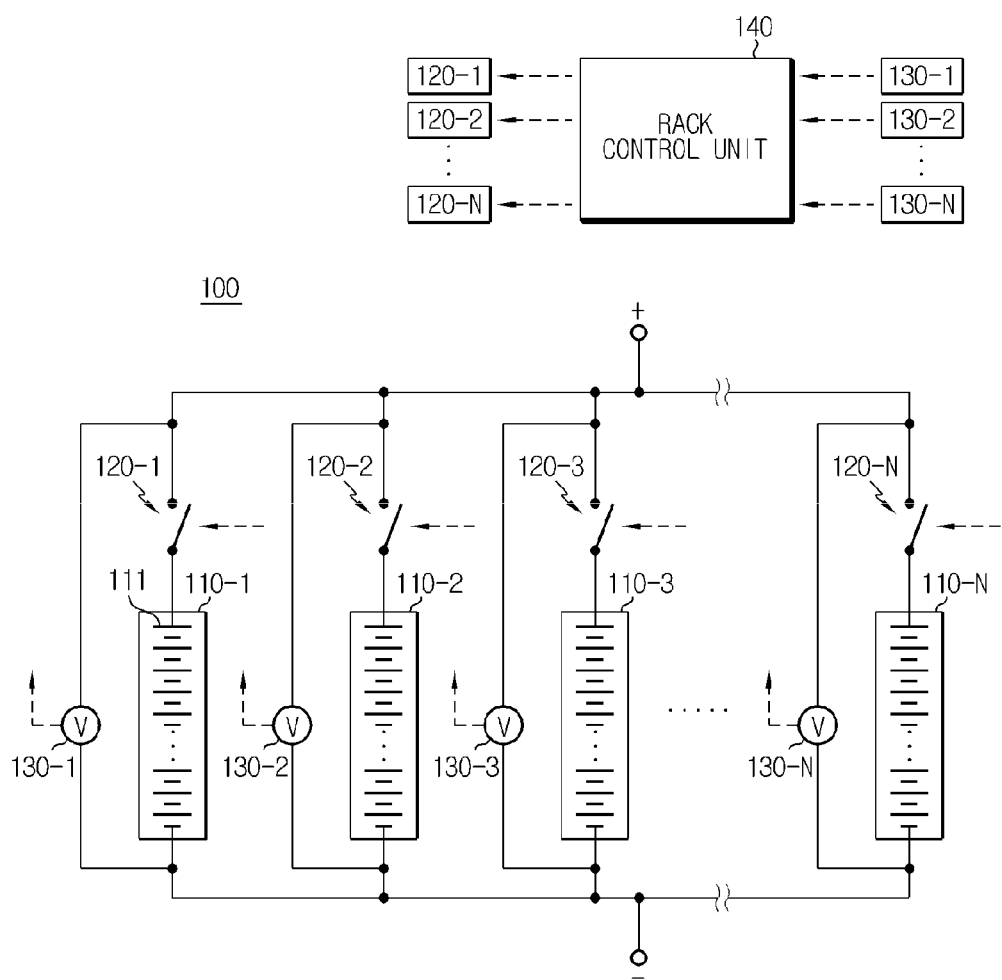
FIG. 1 is a block diagram schematically illustrating construction of an energy storage device according to an exemplary embodiment of the present disclosure.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

FIG. 1 is a block diagram schematically illustrating construction of an energy storage device 100 according to an exemplary embodiment of the present disclosure.

Referring to FIG. 1, the energy storage device 100 according to an exemplary embodiment of the present disclosure includes first to $N^{th}$ battery racks 110-1~110-N, first to $N^{th}$ relay switches 120-1~120-N, first to $N^{th}$ rack voltage sensors 130-1~130-N, and a rack control unit 140.

The first to $N^{th}$ battery racks 110-1~110-N each includes a plurality of secondary battery cells 111 electrically connected in series.

The battery rack 110 includes at least one secondary battery cell 111, and the secondary battery cell 111 is not limited to a particular type. Each secondary battery cell 111 may be a lithium ion battery, a lithium polymer battery, a Ni—Cd battery, a Ni-MH battery, and a Ni—Zn battery, that is rechargeable and needs to consider a charge or discharge voltage. Also, the number of secondary battery cells 111 included in the battery rack 110 may be variously set based on the required output voltage. However, the present disclosure is not limited by a type and an output voltage of the secondary battery cell 111, and the like. Also, although FIG. 1 shows an embodiment in which all the secondary battery cells 111 are connected in series, a battery module (not shown) including the secondary battery cells 111 connected in parallel does not exclude a series connection embodiment. Further, a battery pack including battery modules (not shown) connected in parallel does not exclude a series connection embodiment. That is, in the present disclosure, the battery rack 110 refers to a small capacity energy storage device including secondary batteries as a basic unit of energy storage electrically connected in series.

The first to $N^{th}$ battery racks 110-1~110-N are electrically connected to each other in parallel.

The number N of the battery racks 110 is a natural number greater than or equal to 2, and the number of battery racks may be variously set based on the required charge/discharge capacity.

The first to $N^{th}$ relay switches 120-1~120-N are electrically connected in series to a high potential terminal or a low potential terminal of each battery rack 110. Although FIG. 1 shows an embodiment in which a connection to a high potential terminal of each battery rack 110 is established, the present disclosure is not limited to the illustrated embodiment.

The first to $N^{th}$ relay switches 120-1~120-N may be turned on or off in response to a control signal of the rack control unit 140. When the first to $N^{th}$ relay switches 120-1~120-N are turned on, the first to $N^{th}$ battery racks 110-1~110-N are electrically connected to each other in parallel.

For example, the first to $N^{th}$ relay switches 120-1~120-N may be an electronic relay, and those skilled in the art may employ, as the relay switch, a variety of known switch devices, for example, metal-oxide-semiconductor field-effect transistor (MOSFET).

The first to $N^{th}$ rack voltage sensors 130-1~130-N may be electrically connected to each battery rack 110 in parallel. According to one embodiment, the first to $N^{th}$ rack voltage sensors 130-1~130-N are electrically connected to each battery rack 110 and each relay switch 120 in parallel. When the first to $N^{th}$ relay switches 120-1~120-N corresponding to each voltage sensor are turned on, the first to $N^{th}$ rack voltage sensors 130-1~130-N may measure voltage values of the first to $N^{th}$ battery racks 110-1~110-N corresponding to each voltage sensor, and output signals for the measured voltage values to the rack control unit 140.

The rack control unit 140 may output a signal to control the turn-on or turn-off of the first to $N^{th}$ relay switches 120-1~120-N. Also, the rack control unit 140 may receive the signals for the voltage values of the first to $N^{th}$ battery racks 110-1~110-N from the first to $N^{th}$ rack voltage sensors 130-1~130-N.

The rack control unit 140 according to an exemplary embodiment of the present disclosure may output a control signal to turn on only a relay switch 120 electrically connected to any one battery rack (hereinafter referred to as a target rack) among the first to $N^{th}$ battery racks 110-1~110-N, and may calibrate a signal for a voltage value outputted from a voltage sensor electrically connected to the target rack based on a sum of voltage values of secondary battery cells included in the target rack.

A method for calibrating a voltage sensor by the rack control unit 140 will be hereinafter described in more detail. To execute various control logics to be described in further detail below, the rack control unit 140 may optionally include a processor, an application-specific integrated circuit (ASIC), a chipset, a logic circuit, a register, a communication modem, and a data processing device known in the technical field to which the invention pertains. Also, when the control logic is implemented in software, the rack control unit 140 may be implemented as an assembly of program modules. In this instance, the program module may be stored in a memory and executed by a processor.

FIG. 2 is a flowchart illustrating a method for calibrating a rack voltage sensor of an energy storage device according to an exemplary embodiment of the present disclosure.

Referring to FIGS. 1 and 2 together, first, at step 200, the rack control unit 140 turns off all the first to $N^{th}$ relay switches 120-1~120-N. The method finishes step 200 and advances to step 210.

At step 210, the rack control unit 140 sets and stores an initial value of an index as 'k=0'. The method finishes step 210 and advances to step 220.

At step 220, the rack control unit 140 determines if the value of the index is 'k=N+1'. If the value of step 220 equals 'YES', the rack control unit 140 determines that calibration of the first to $N^{th}$ rack voltage sensors 130-1~130-N is completed and terminates the method. In contrast, if the value of step 220 equals 'NO', the rack control unit 140 advances to step 230.

At step 230, the rack control unit 140 sets and stores the value of the index as 'k=k+1'. That is, the rack control unit 140 increases the value of k by 1. The method finishes step 230 and advances to step 240.

At step 240, the rack control unit 140 turns on a $k^{th}$ relay switch 120-k. The method finishes step 240 and advances to step 250.

At step 250, the rack control unit 140 receives a signal for a voltage value outputted from a $k^{th}$ rack voltage sensor 130-k. The method finishes step 250 and advances to step 260.

At step 260, the rack control unit 140 calibrates the signal for the voltage value outputted from the $k^{th}$ rack voltage sensor 130-k electrically connected to a $k^{th}$ battery rack 110-k based on a sum of voltage values of secondary battery cells included in the $k^{th}$ battery rack 110-k. As described above, the secondary battery cells 111 included in each battery rack 110 are electrically connected in series. Thus, a sum of voltage values of the secondary battery cells 111 included in each battery rack 110 should be equal to a value of each rack voltage sensor 130. That is, it is necessary to make a voltage value measured from each rack voltage sensor 130 equal to a sum of voltage values of the secondary battery cells 111 included in each battery rack 110. The method finishes step 260 and advances to step 270.

At step 270, the rack control unit 140 turns off the $k^{th}$ relay switch 120-k. The method finishes step 270 and reverts to step 220.

At step 220, the rack control unit 140 iteratively performs steps 230 to 260 until 'k=N+1'. As a result, the rack control unit 140 may turn on all the first to $N^{th}$ relay switches 120-1~120-N one by one in a sequential order. Thus, after calibrating the first to $N^{th}$ rack voltage sensors 130-1~130-N, the method is existed.

According to an exemplary embodiment of the present disclosure, the rack control unit 140 may directly receive the voltage values of the plurality of secondary battery cells 111 included in each battery rack 110 from a plurality of cell voltage sensors (not shown) which measure the voltage values of the plurality of secondary battery cells 111 and output signals, and may sum up the voltage values of the secondary battery cells 111 included in the target rack.

According to another exemplary embodiment of the present disclosure, the first to $N^{th}$ battery racks 110-1~110-N include first to $N^{th}$ cell management units (not shown) to receive signals for voltage values from a plurality of secondary battery cell voltage sensors (not shown) included in each battery rack 110, respectively. In this case, the rack control unit 140 may receive the voltage values of the plurality of secondary battery cells 111 included in the target rack from the first to $N^{th}$ cell management units (not shown), and sum up the voltage values of the secondary battery cells included in the target rack.

According to another exemplary embodiment of the present disclosure, the first to $N^{th}$ battery racks 110-1~110-N include first to $N^{th}$ cell management units (not shown) to receive signals for voltage values from a plurality of secondary battery cell voltage sensors (not shown) included in each battery rack 110, respectively, and sum up the voltage values of the secondary battery cells included in the target rack. In this case, the rack control unit 140 may receive a sum of the voltage values of the secondary battery cells included in the target rack from the first to $N^{th}$ cell management units.

According to the present disclosure, the voltage sensor which measures the voltage of the battery rack may be accurately calibrated.

Also, in the description of the present disclosure, it should be understood that each element of the present invention shown in FIG. 1 is distinguished logically rather than physically.

That is, each element corresponds to a logic element to realize the technical spirit of the present disclosure, and accordingly, even though each element is integrated or separated, it should be construed as falling within the scope of the present disclosure if a function performed by a logic element of the present disclosure can be implemented. It should be further understood that it falls within the scope of the present disclosure regardless of whether names are identical or not if it is an element performing an identical or similar function.

Hereinabove, the present disclosure has been described by limited embodiments and drawings, but the present disclosure is not limited thereto and it should be understood that various changes and modifications may be made by an ordinary person skilled in the art within the spirit and scope of the disclosure and the appended claims and their equivalents.

What is claimed is:

1. An energy storage device comprising:
   first to $N^{th}$ battery racks, each including a plurality of secondary battery cells electrically connected in series, the first to $N^{th}$ battery racks being electrically connected to each other in parallel;
   first to $N^{th}$ relay switches electrically connected in series to a high potential terminal or a low potential terminal of each battery rack, and designed to turn on or off in response to a control signal;
   first to $N^{th}$ rack voltage sensors electrically connected to each battery rack and each relay switch in parallel, and configured to output a measured voltage value as a signal; and
   a rack control unit configured to output a signal to control the turn-on or turn-off of the first to $N^{th}$ relay switches, and to receive the signals for the voltage values of the first to $N^{th}$ battery racks from the first to $N^{th}$ rack voltage sensors, wherein the rack control unit outputs a control signal to turn on only a relay switch electrically connected to any one battery rack (hereinafter referred to as a target rack) among the first to $N^{th}$ battery racks, and calibrates a signal for a voltage value outputted from a voltage sensor electrically connected to the target rack based on a sum of voltage values of secondary battery cells included in the target rack.

2. The energy storage device according to claim 1, wherein the rack control unit turns on all the first to $N^{th}$ relay switches one by one in a sequential order.

3. The energy storage device according to claim 1, wherein the rack control unit receives the voltage values of the plurality of secondary battery cells included in each battery rack directly from a plurality of cell voltage sensors, and sums up the voltage values of the secondary battery cells included in the target rack, the cell voltage sensors being configured to measure the voltage values of the plurality of secondary battery cells and output signals.

4. The energy storage device according to claim 1, wherein the rack control unit receives the voltage values of the plurality of secondary battery cells included in the target rack from first to $N^{th}$ cell management units, and sums up the voltage values of the secondary battery cells included in the target rack, the first to $N^{th}$ cell management units being configured to receive signals for voltage values from a plurality of secondary battery cell voltage sensors included in each battery rack, respectively.

5. The energy storage device according to claim 1, wherein the rack control unit receives a sum of the voltage values of the secondary battery cells included in the target rack from first to $N^{th}$ cell management units configured to receive signals for voltage values from a plurality of secondary battery cell voltage sensors included in each battery rack, respectively, and to sum up the voltage values of the secondary battery cells included in the target rack.

6. A method for calibrating a rack voltage sensor of an energy storage device, the energy storage device comprising first to $N^{th}$ battery racks including a plurality of secondary battery cells electrically connected in series, first to $N^{th}$ relay switches electrically connected in series to a high potential terminal or a low potential terminal of each battery rack, and designed to turn on or off in response to a control signal, first to $N^{th}$ rack voltage sensors electrically connected to each battery rack and each relay switch in parallel, and configured to output a measured voltage value as a signal, and a rack control unit configured to output a signal to control the turn-on or turn-off of the first to $N^{th}$ relay switches, and to receive the signals for the voltage values of the first to $N^{th}$ battery racks from the first to $N^{th}$ rack voltage sensors, the method comprising:
(a) outputting, by the rack control unit, a control signal to turn on only a relay switch electrically connected to any one battery rack (hereinafter referred to as a target rack) among the first to $N^{th}$ battery racks; and
(b) calibrating, by the rack control unit, a signal for a voltage value outputted from a voltage sensor electrically connected to the target rack based on a sum of voltage values of secondary battery cells included in the target rack.

7. The method for calibrating a rack voltage sensor of an energy storage device according to claim 6, wherein the step (a) and the step (b) are iteratively performed until the operation of turning on all the first to $N^{th}$ relay switches one by one in a sequential order by the rack control unit is completed.

8. The method for calibrating a rack voltage sensor of an energy storage device according to claim 6, wherein the step (b) further comprises receiving, by the rack control unit, the voltage values of the plurality of secondary battery cells included in each battery rack directly from a plurality of cell voltage sensors, and summing up the voltage values of the secondary battery cells included in the target rack, the cell voltage sensors being configured to measure the voltage values of the plurality of secondary battery cells and output signals.

9. The method for calibrating a rack voltage sensor of an energy storage device according to claim 6, wherein the step (b) further comprises receiving, by the rack control unit, the voltage values of the plurality of secondary battery cells included in the target rack from first to $N^{th}$ cell management units, and summing up the voltage values of the secondary battery cells included in the target rack, the first to $N^{th}$ cell management units being configured to receive signals for voltage values from a plurality of secondary battery cell voltage sensors included in each battery rack, respectively.

10. The method for calibrating a rack voltage sensor of an energy storage device according to claim 6, wherein the step (b) further comprises receiving, by the rack control unit, a sum of the voltage values of the secondary battery cells included in the target rack from first to $N^{th}$ cell management units configured to receive signals for voltage values from a plurality of secondary battery cell voltage sensors included in each battery rack, respectively, and to sum up the voltage values of the secondary battery cells included in the target rack.

* * * * *